United States Patent
Nomura et al.

(10) Patent No.: US 9,444,399 B2
(45) Date of Patent: Sep. 13, 2016

(54) SEMICONDUCTOR CIRCUIT DEVICE, ELECTRONIC APPARATUS, AND MOVING OBJECT

(71) Applicant: Seiko Epson Corporation, Tokyo (JP)

(72) Inventors: Masataka Nomura, Minowa (JP); Hitoshi Kobayashi, Okaya (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 14/807,236

(22) Filed: Jul. 23, 2015

(65) Prior Publication Data

US 2016/0028346 A1 Jan. 28, 2016

(30) Foreign Application Priority Data

Jul. 25, 2014 (JP) .................. 2014-151565

(51) Int. Cl.
*H03B 5/12* (2006.01)
*H03B 5/04* (2006.01)

(52) U.S. Cl.
CPC ........ *H03B 5/12* (2013.01); *H03B 5/04* (2013.01); *H03B 2200/0022* (2013.01); *H03B 2200/0026* (2013.01)

(58) Field of Classification Search
CPC ..................................................... H01L 23/12
USPC ..................................................... 331/108 C
See application file for complete search history.

(56) References Cited

U.S. PATENT DOCUMENTS 6,492,692 B1 12/2002 Ishii et al.
2009/0315630 A1* 12/2009 Xiong ............... H03B 5/1228
331/108 C

FOREIGN PATENT DOCUMENTS

| JP | 01-286448 A | 11/1989 |
| JP | 10-233507 A | 9/1998 |
| JP | 2004-064016 A | 2/2004 |
| JP | 2009-267212 A | 11/2009 |

* cited by examiner

*Primary Examiner* — Joseph Chang
(74) *Attorney, Agent, or Firm* — Harness, Dickey & Pierce, P.L.C.

(57) ABSTRACT

A semiconductor circuit device includes: a semiconductor circuit provided on a main surface of a semiconductor substrate; and a thin film circuit element including a conductive thin film and disposed on the main surface of the semiconductor substrate. The semiconductor circuit is provided between the thin film circuit element and a peripheral portion of the semiconductor substrate in a plan view.

10 Claims, 7 Drawing Sheets

SEMICONDUCTOR CIRCUIT DEVICE, ELECTRONIC APPARATUS, AND MOVING OBJECT

BACKGROUND

1. Technical Field

The present invention relates to a semiconductor circuit device, an electronic apparatus using the semiconductor circuit device, and a moving object.

2. Related Art

Heretofore, a semiconductor device including an integrated circuit (semiconductor circuit) provided in a semiconductor substrate, an insulating layer provided on the semiconductor substrate, and an inductance element provided on the insulating layer has been disclosed (e.g., refer to JP-A-2009-267212).

However, the semiconductor device disclosed in JP-A-2009-267212 has a configuration in which the integrated circuit (semiconductor circuit) and the inductance element (inductance circuit) are disposed to overlap each other in a plan view. In such a configuration, when, for example, the integrated circuit (semiconductor circuit) is an oscillation circuit including a variable capacitance element, the inductance of the inductance element changes or the capacitance value or the like of the variable capacitance element changes due to the electromagnetic coupling between the variable capacitance element and the inductance element. Due to this, there is the possibility that an oscillation frequency output from the oscillation circuit may vary.

SUMMARY

An advantage of some aspects of the invention is to solve at least a part of the problems described above, and the invention can be implemented as the following forms or application examples.

APPLICATION EXAMPLE 1

A semiconductor circuit device according to this application example includes: a semiconductor circuit provided on a main surface of a semiconductor substrate; and a thin film circuit element disposed on the main surface side of the semiconductor substrate and including a conductive thin film, wherein the semiconductor circuit is provided between the thin film circuit element and a peripheral portion of the semiconductor substrate in a plan view.

According to this application example, the semiconductor circuit is disposed between the thin film circuit element and the peripheral portion of the semiconductor substrate in the plan view. Therefore, since the semiconductor circuit and the thin film circuit element do not overlap in the plan view, the electromagnetic coupling between the semiconductor circuit and the thin film circuit element is reduced. Moreover, the semiconductor circuit is disposed between the thin film circuit element and the peripheral portion of the semiconductor substrate in the plan view, in other words, the semiconductor circuit is disposed outside the thin film circuit element in the plan view. For this reason, when, for example, the thin film circuit element is an element to cause a magnetic field, the magnetic field density outside the thin film circuit element is generally smaller than the magnetic flux density inside the thin film circuit element, and therefore, by disposing the semiconductor circuit outside the thin film circuit element, the electromagnetic coupling between the semiconductor circuit and the thin film circuit element is reduced. This makes it possible to reduce variation in the characteristic value of the thin film circuit element due to the electromagnetic coupling between the semiconductor circuit and the thin film circuit element. Hence, when, for example, the thin film circuit element is a circuit to be used in an oscillation loop of an oscillation circuit, it is possible to reduce variation in oscillation frequency caused by the variation in the characteristic value of the thin film circuit element.

APPLICATION EXAMPLE 2

In the semiconductor circuit device according to the application example described above, it is preferable that the semiconductor circuit device further includes a first insulating film provided so as to overlap the main surface and the semiconductor circuit, and that the thin film circuit element is provided on a surface of the first insulating film opposite to a surface thereof in contact with at least one of the main surface and the semiconductor circuit.

According to this application example, since the semiconductor circuit and the thin film circuit element are disposed via the first insulating film, it is possible to reduce an electrical insulation failure such as a short circuit between the semiconductor circuit and the thin film circuit element.

APPLICATION EXAMPLE 3

In the semiconductor circuit device according to the application example described above, it is preferable that the semiconductor circuit device further includes an external connection terminal disposed on the first insulating film at a position overlapping the semiconductor circuit and not overlapping the thin film circuit element in the plan view.

According to this application example, since the external connection terminal disposed to overlap the semiconductor circuit in the plan view can be used as a shield electrode of the semiconductor circuit, it is possible to suppress the influence of external noise on the semiconductor circuit. For example, when the circuit of the application example is used as a circuit to be used in an oscillation loop of an oscillation circuit, it is possible to reduce the possibility that external noise may constitute noise for the oscillation frequency. Moreover, since the external connection terminal is disposed at a position not overlapping the thin film circuit element, the electromagnetic coupling between the thin film circuit element and the semiconductor circuit can be suppressed, and thus it is possible to reduce variation in element value used for the thin film circuit element or the semiconductor circuit. This makes it possible, for example, to reduce variation in the oscillation frequency of the oscillation circuit.

APPLICATION EXAMPLE 4

In the semiconductor circuit device according to the application example described above, it is preferable that the semiconductor circuit device further includes: a second insulating film covering at least the thin film circuit element; and an external connection terminal disposed on the second insulating film at a position overlapping the semiconductor circuit and not overlapping the thin film circuit element in the plan view.

According to this application example, the second insulating film prevents an electrical short circuit between the thin film circuit element and the external connection terminal, and also, the external connection terminal can be used as a shield electrode of the semiconductor circuit. Therefore, it is possible to suppress the influence of external noise on the semiconductor circuit. For example, when the circuit of the application example is used as a circuit to be used in an oscillation loop of an oscillation circuit, it is possible to reduce the possibility that external noise may constitute noise for the oscillation frequency. Moreover, since the external connection terminal is disposed at a position not overlapping the thin film circuit element, the electromagnetic coupling between the thin film circuit element and the semiconductor circuit can be suppressed, and thus it is possible to reduce variation in element value used for the thin film circuit element or the semiconductor circuit. This makes it possible, for example, to reduce the variation in the oscillation frequency of the oscillation circuit.

APPLICATION EXAMPLE 5

In the semiconductor circuit device according to the application example described above, it is preferable that the semiconductor circuit includes a capacitance element, and that the thin film circuit element includes an inductance circuit.

According to this application example, the semiconductor circuit includes the capacitance element, the thin film circuit element includes the inductance circuit, and it is possible to constitute a circuit for oscillation to be used in an oscillation loop of an oscillation circuit including the semiconductor circuit including the capacitance element and the thin film circuit element including the inductance circuit. In such a circuit for oscillation, when the inductance circuit is used as an extension coil, if the inductance circuit and the capacitance element are electromagnetically coupled to each other, a stray capacitance occurs, for example, between the inductance circuit and the capacitance element to vary the inductance value of the inductance circuit or the capacitance value of the capacitance element, and thus there is a possibility to vary the oscillation frequency. With the use of this configuration, since the electromagnetic coupling can be reduced, the variation in the inductance value of the inductance circuit or the capacitance value of the capacitance element can be reduced, and thus it is possible, for example, to reduce the variation in the oscillation frequency of the oscillation circuit.

APPLICATION EXAMPLE 6

In the semiconductor circuit device according to the application example described above, it is preferable that the inductance circuit is a wire disposed in a spiral form in the plan view.

According to this application example, the semiconductor circuit is disposed outside a region where the inductance circuit is formed in the plan view. The magnetic flux density is high inside the spiral pattern of the inductance circuit compared to that outside the spiral pattern (a region between the inductance circuit and the peripheral portion of the semiconductor substrate). Hence, when the semiconductor circuit is disposed inside the spiral pattern in the plan view, the electromagnetic coupling between the inductance circuit and the semiconductor circuit becomes strong, and thus there is the possibility that the variation in inductance value may increase. With the use of this configuration, since the electromagnetic coupling can be reduced, the variation in the characteristic value of the inductance circuit can be reduced, and thus it is possible, for example, to reduce the variation in the oscillation frequency of the oscillation circuit.

APPLICATION EXAMPLE 7

In the semiconductor circuit device according to the application example described above, it is preferable that the semiconductor circuit includes a resistance circuit electrically connected to the inductance circuit.

According to this application example, since the characteristics of the inductance circuit, particularly, the Q value can be adjusted using the resistance circuit electrically connected to the inductance circuit, it is possible, for example, to reduce abnormal oscillation caused by the inductance circuit upon the activation of the oscillation circuit.

APPLICATION EXAMPLE 8

In the semiconductor circuit device according to the application example described above, it is preferable that a resistance value of the resistance circuit can be variably controlled.

According to this application example, the resistance value of the resistance circuit electrically connected to the inductance circuit is variably controlled, so that the Q value of the inductance circuit can be adjusted every time, for example, an oscillation frequency or an equivalent circuit constant or the like of a vibrator to be used is changed. For this reason, even when the oscillation frequency or the equivalent circuit constant or the like of the vibrator to be used is changed, it is possible to make an adjustment so as not to cause abnormal oscillation.

APPLICATION EXAMPLE 9

An electronic apparatus according to this application example includes the semiconductor circuit device according to any one of the application examples described above.

According to this application example, since the semiconductor circuit device in which the variation in the characteristic value of the semiconductor circuit or the characteristic value of the thin film circuit element due to the electromagnetic coupling between the semiconductor circuit and the thin film circuit element is reduced is included, it is possible to provide an electronic apparatus that can maintain stable characteristics.

APPLICATION EXAMPLE 10

A moving object according to this application example includes the semiconductor circuit device according to any one of the application examples described above.

According to this application example, since the semiconductor circuit device in which the variation in the characteristic value of the semiconductor circuit or the characteristic value of the thin film circuit element due to the electromagnetic coupling between the semiconductor circuit and the thin film circuit element is reduced is included, it is possible to provide a moving object that can maintain stable characteristics.

BRIEF DESCRIPTION OF THE DRAWINGS

The invention will be described with reference to the accompanying drawings, wherein like numbers reference like elements.

FIGS. 1A and 1B show a semiconductor circuit device according to a first embodiment, in which

FIGS. 3A and 3B show a semiconductor circuit device according to a second embodiment, in which

DESCRIPTION OF EXEMPLARY EMBODIMENTS

Hereinafter, preferred embodiments of the invention will be described with reference to the accompanying drawings. In the accompanying drawings, shapes, scales, and the like are differently represented in some portions from actual ones for convenience of description.

Semiconductor Circuit Device
First Embodiment

Figure 1A:
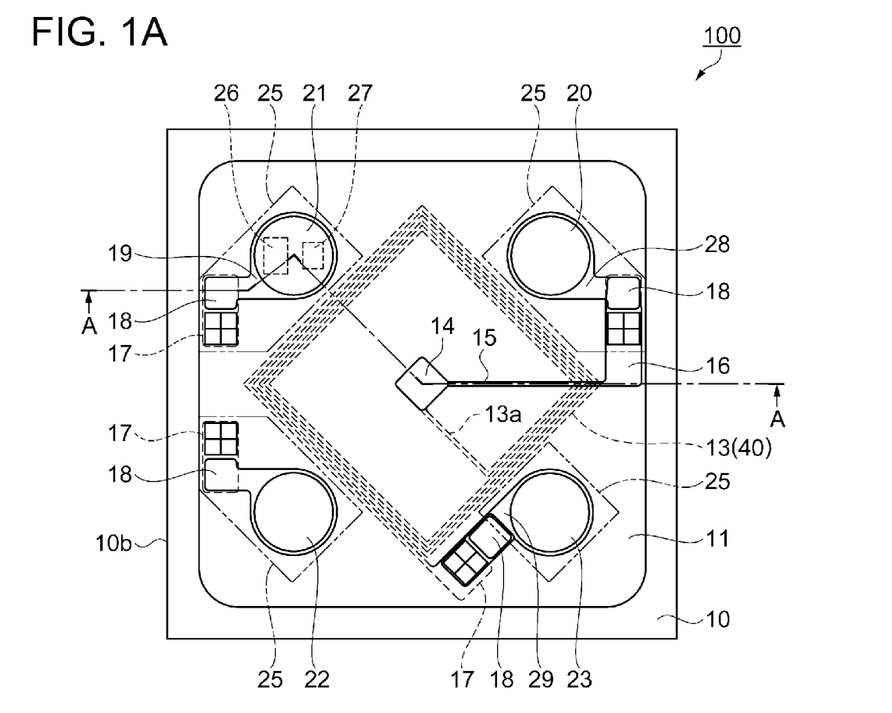
FIG. 1A is a plan view and FIG. 1B is a cross-sectional view taken along the line A-A in FIG. 1A.
Figure 1B:
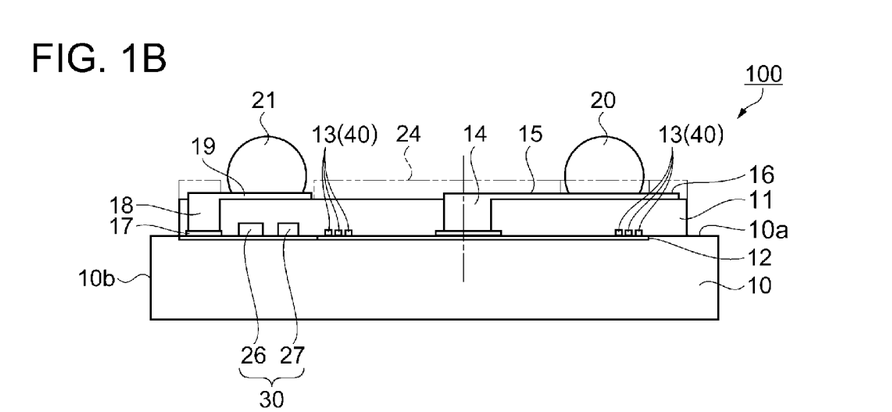
Figure 2:
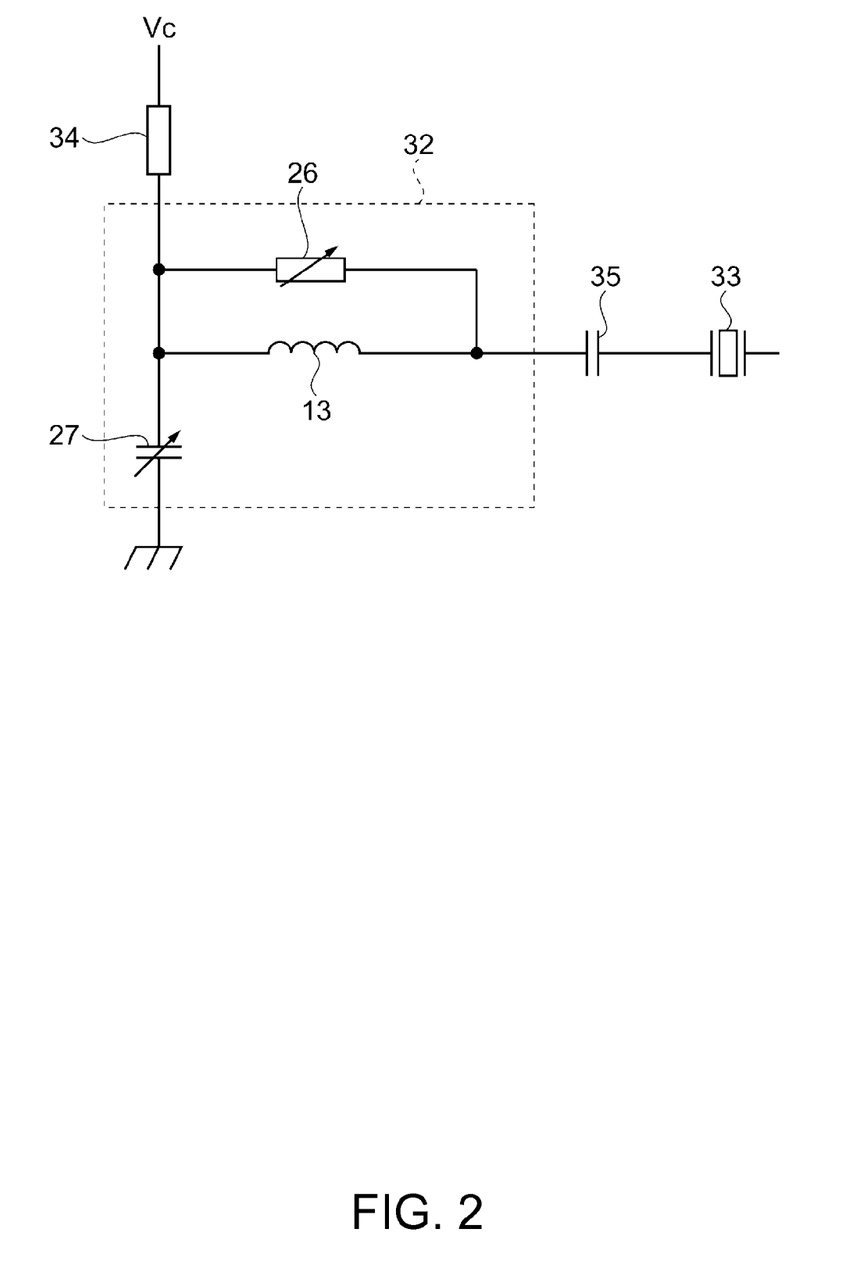
FIG. 2 is a circuit configuration diagram showing an example of a semiconductor circuit provided in the semiconductor circuit device.

A semiconductor circuit device according to a first embodiment of the invention will be described with reference to FIGS. 1A to 2. In the description, a semiconductor circuit device including, as a semiconductor circuit, at least a circuit for oscillation connected in an oscillation loop of an oscillation circuit that oscillates a piezoelectric vibrator element, a surface acoustic wave vibrator element, or the like will be illustrated. FIGS. 1A and 1B show the semiconductor circuit device according to the first embodiment, in which FIG. 1A is a plan view and FIG. 1B is a cross-sectional view taken along the line A-A in FIG. 1A. In FIG. 1A, a solder resist 24 shown in FIG. 1B is omitted for improving the clarity of the drawing. FIG. 2 is a circuit configuration diagram showing an example of a semiconductor circuit provided in the semiconductor circuit device.

As shown in FIGS. 1A and 1B, the semiconductor circuit device 100 according to the first embodiment includes a semiconductor circuit 30 provided on a main surface 10a of a semiconductor substrate 10 having a rectangular shape, and a thin film circuit element 40 including an inductance circuit 13. Further, the semiconductor circuit device 100 includes a first insulating film 11 provided on the main surface 10a of the semiconductor substrate 10 and external connection terminals 20, 21, 22, and 23 provided on the first insulating film 11 on the side opposite to the main surface 10a. Although wires that electrically connect the semiconductor circuit 30, the thin film circuit element 40, and the like are provided on the main surface 10a or an insulating portion 12, the wires are omitted in FIGS. 1A and 1B.

The semiconductor substrate 10 is provided with the insulating portion 12 at a surface layer portion on the main surface 10a side. In the embodiment, a surface of the semiconductor substrate 10 including a front surface of the insulating portion 12 is defined as the main surface 10a.

The semiconductor circuit 30 is provided between the inductance circuit 13 (the thin film circuit element 40) and a peripheral portion 10b of the semiconductor substrate 10 in a plan view. In other words, the semiconductor circuit 30 is disposed at a position not overlapping the inductance circuit 13 (the thin film circuit element 40) in the plan view.

The semiconductor circuit 30 includes, for example, a resistance circuit 26, a capacitance element 27 (variable capacitance element), a resistance element 34 (refer to FIG. 2), and a capacitance element 35 (refer to FIG. 2), and is provided on the main surface 10a side of the semiconductor substrate 10. The resistance circuit 26, the capacitance element 27 (variable capacitance element), the resistance element 34, the capacitance element 35, and the inductance circuit are connected with the respective circuits as necessary through wires (not shown). The resistance value of the resistance circuit 26 is variable. The resistance circuit 26 is controlled so as to vary the resistance value based on a control signal input thereto, and has a function of adjusting at least the characteristics of the inductance circuit 13. For the capacitance element 27, for example, a variable capacitance diode (also referred to as a varactor or varicap) is used.

In the embodiment, a circuit for oscillation 32 is configured to include the resistance circuit 26 or the capacitance element 27 (the semiconductor circuit 30) and the inductance circuit 13 (the thin film circuit element 40) as shown in FIG. 2, and is connected with a vibrating element 33 such as a piezoelectric vibrator element or a surface acoustic wave element. For the vibrating element 33, a MEMS vibrator element or the like can be used other than a piezoelectric vibrator element or a surface acoustic wave element. Moreover, as the material of the vibrating element 33, a piezoelectric material, such as piezoelectric single crystal such as quartz crystal including AT-cut quartz crystal, Z-cut quartz crystal, BT-cut quartz crystal, and SC-cut quartz crystal, lithium tantalate, or lithium niobate, or piezoelectric ceramics such as lead zirconate titanate, or silicon semiconductor or the like may be used. Further, the shape of the vibrating element 33 is not particularly limited, and may be a bipod tuning fork, H-type tuning fork, tripod tuning fork, comb teeth type, orthogonal type, prism type, or the like. As a means of exciting the vibrating element 33, a means using a piezoelectric effect may be used, or electrostatic driving using the Coulomb force may be used.

According to this configuration, the characteristics of the inductance circuit 13, particularly, the Q value is adjusted by the resistance circuit 26, so that abnormal oscillation caused by the inductance circuit 13 can be reduced upon the activation of the oscillation circuit including the circuit for oscillation 32. Moreover, since the resistance value of the resistance circuit 26 is variably controlled based on the control signal input thereto, the Q value of the inductance circuit 13 can be adjusted every time, for example, an oscillation frequency or an equivalent circuit constant or the like of a vibrator (the vibrating element 33) to be used is changed. For this reason, by variably controlling the resistance value of the resistance circuit 26, even when the oscillation frequency or the equivalent circuit constant or the like of the vibrator (the vibrating element 33) to be used is changed, it is possible to make an adjustment so as not to cause abnormal oscillation.

The external connection terminals 20, 21, 22, and are each provided inside the four corners of the semiconductor substrate 10. The external connection terminals 20, 21, 22, and 23 are generally hemispheroids having conductivity, and formed using, for example, solder balls. The external connection terminals 20, 21, 22, and 23 are disposed at positions at which at least a portion of the external connection terminals 20, 21, 22, and 23 overlaps the semiconductor circuit 30 and the external connection terminals 20, 21, 22, and 23 do not overlap the thin film circuit element 40 (the inductance circuit 13) in the plan view. Other than using the solder ball, the external connection terminals 20, 21, 22, and 23 may be formed by plating a single layer of metal such as gold, silver, copper, or nickel, or plating a multi-layer using the metals together, or may be formed by screen printing metal such as solder and then heating and fusing the metal.

By disposing the external connection terminals 20, 21, 22, and 23 as described above, the external connection terminals 20, 21, 22, and 23 can be used as a shield electrode of the semiconductor circuit 30, and therefore, it is possible to suppress the influence of external noise on the semiconductor circuit 30. For example, when the semiconductor circuit 30 is used as the circuit for oscillation 32, it is possible to reduce the possibility that external noise may constitute noise for the oscillation frequency. Moreover, the external connection terminals 20, 21, 22, and 23 are disposed at positions not overlapping the thin film circuit element 40 (the inductance circuit 13), in other words, the semiconductor circuit 30 is disposed outside a region where the thin film circuit element 40 (the inductance circuit 13) is formed in the plan view. Since this makes it possible to increase the distance between the inductance circuit 13 and the semiconductor circuit 30, the electromagnetic coupling therebetween can be suppressed. Due to this, it is possible to reduce variation in the inductance value of the thin film circuit element 40 (the inductance circuit 13). Due to this, it is possible, for example, to reduce variation in the oscillation frequency of the oscillation circuit.

The arrangement of the external connection terminals 20, 21, 22, and 23 is not limited to that described above. For example, the plurality of external connection terminals may be disposed together at one location, or the plurality of external connection terminals may not be disposed so as to correspond to all of the corners (four corners).

Moreover, the semiconductor circuit 30 may be provided so as to overlap, in the plan view, a vicinity region 25 in which each of the external connection terminals 20, 21, 22, and 23 is included. Even when the semiconductor circuit 30 and the external connection terminals 20, 21, 22, and 23 are disposed as described above, the external connection terminals 20, 21, 22, and 23 can be used as a shield electrode of the semiconductor circuit 30. Similarly to the external connection terminals 20, 21, 22, and 23 described above, land electrodes 19, 28, and 29 disposed below the external connection terminals 20, 21, 22, and 23 also function as a shield electrode of the semiconductor circuit 30, and therefore, it is possible to suppress the influence of external noise on the semiconductor circuit 30.

Through-electrodes 14 and 18 penetrate the first insulating film 11 and establish an electrical connection between a front surface (surface on the main surface 10*a* side of the semiconductor substrate 10) and a back surface (surface on the side opposite to the surface on the main surface 10*a* side) of the first insulating film 11. That is, the semiconductor circuit 30, the inductance circuit 13, or the like provided on the main surface 10*a* of the semiconductor substrate 10 is electrically connected with the external connection terminals 20, 21, 22, and 23 or the like provided on the first insulating film 11 on the side opposite to the main surface 10*a* via the through-electrodes 14 and 18, or land electrodes 17 provided on the main surface 10*a* side of the semiconductor substrate 10.

The thin film circuit element 40 includes the inductance circuit 13, which is formed in a spiral form with a square planar shape, and is provided on the insulating portion 12 provided on the main surface 10*a* side of the semiconductor substrate 10. The inductance circuit 13 is composed of a thin film having conductivity. The inductance circuit 13 is composed of a thin film formed using, as the thin film material, a single layer of copper (Cu), gold (Au), silver (Ag), or nickel (Ni), or a multi-layer film using the metals together.

One end of the inductance circuit 13 formed in a spiral form is connected to, for example, a vibrator (not shown) (the vibrating element 33) via the external connection terminal 23. The inductance circuit 13 and the external connection terminal 23 are electrically connected through the land electrode 17, the through-electrode 18 connected with the land electrode 17, and the land electrode 29 connected with the through-electrode 18 and provided on the first insulating film 11. Moreover, the other end of the inductance circuit 13 is connected to the through-electrode 14 via a first lead wire 13*a*. The through-electrode 14 is connected with the external connection terminal 20 via second lead wires 15 and 16 provided on the first insulating film 11 and the land electrode 28, and is connected to the vibrator (the vibrating element 33), oscillation circuit, or the like (not shown). That is, both ends of the inductance circuit 13 formed in a spiral form are connected in an oscillation loop of the oscillation circuit (not shown) via the external connection terminals 20 and 23.

When the spiral pattern of the inductance circuit 13 is viewed in the plan view, the magnetic flux density is high inside the spiral pattern compared to that of the outside portion (region between the inductance circuit 13 and the peripheral portion 10*b* of the semiconductor substrate 10) of the spiral pattern. Hence, when the semiconductor circuit 30 is disposed inside the spiral pattern in the plan view, the electromagnetic coupling between the inductance circuit 13 and the semiconductor circuit 30 becomes strong, and thus there is the possibility that the variation in inductance value may increase or the variation in the characteristics of the semiconductor circuit 30 may increase. With the use of this configuration, since the electromagnetic coupling between the inductance circuit 13 and the semiconductor circuit 30 can be reduced, the variation in the characteristic value of the inductance circuit 13 can be reduced or the variation in the characteristics of the semiconductor circuit 30 can be reduced, and thus it is possible, for example, to reduce the variation in the oscillation frequency of the oscillation circuit.

When the inductance circuit 13 (inductance element) is used as an extension coil in the oscillation circuit, if the inductance circuit 13 and the capacitance element 27 are electromagnetically coupled to each other, a stray capacitance occurs, for example, between the inductance circuit 13 and the capacitance element 27 to vary the inductance value of the inductance circuit 13 (inductance element), and thus there is a possibility to vary the oscillation frequency.

According to the semiconductor circuit device 100 according to the first embodiment, the circuit for oscillation including the semiconductor circuit 30 including the capacitance element 27 and the thin film circuit element 40 including the inductance circuit 13 is configured. With the use of the configuration, since the electromagnetic coupling between the semiconductor circuit 30 and the thin film circuit element 40 can be reduced as described above, the variation in the inductance value of the inductance circuit 13 can be reduced, and thus it is possible, for example, to reduce the variation in the oscillation frequency of the oscillation circuit including the circuit for oscillation 32.

Second Embodiment

Figure 3A:
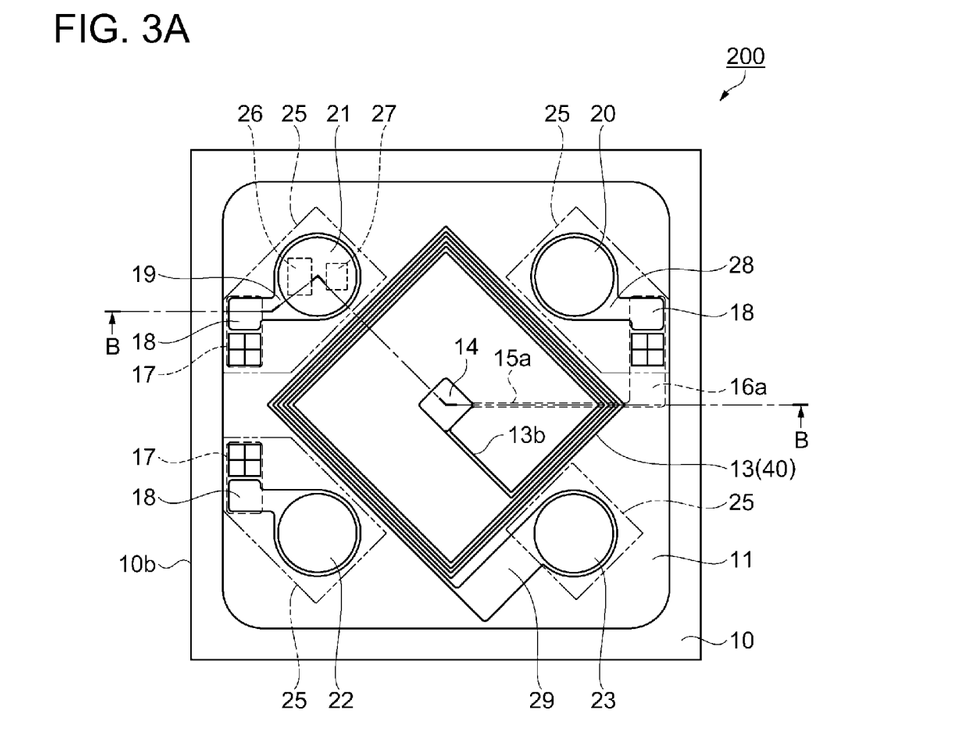
FIG. 3A is a plan view and FIG. 3B is a cross-sectional view taken along the line B-B in FIG. 3A.
Figure 3B:
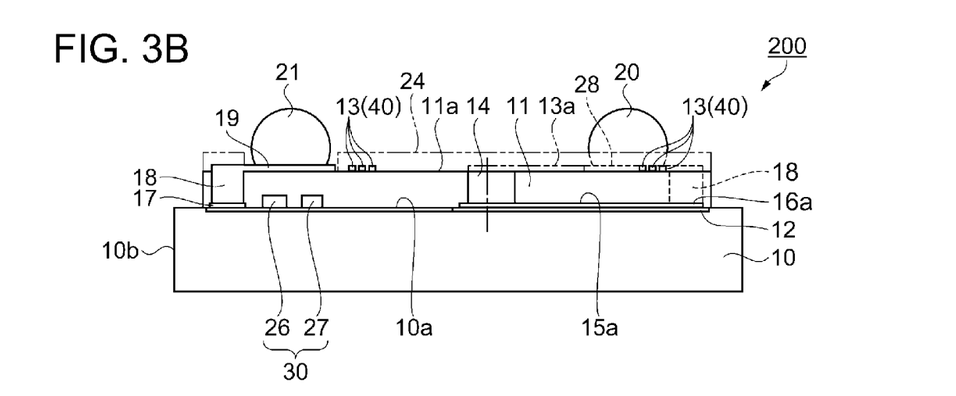

A semiconductor circuit device according to a second embodiment of the invention will be described with reference to FIGS. 3A and 3B. For the semiconductor circuit device of the second embodiment, a semiconductor circuit device including at least a circuit for oscillation similar to that of the first embodiment will be illustrated. FIGS. 3A and 3B show the semiconductor circuit device according to the second embodiment, in which FIG. 3A is a plan view and FIG. 3B is a cross-sectional view taken along the line B-B in FIG. 3A. In FIG. 3A, a solder resist 24 shown in FIG. 3B is omitted for improving the clarity of the drawing. Moreover, configurations similar to those of the first embodiment are denoted by the same reference numerals and signs, and the descriptions thereof are omitted in some cases.

The semiconductor circuit device 200 according to the second embodiment differs from the semiconductor circuit device 100 according to the first embodiment in the position at which a thin film circuit element 40 including an inductance circuit 13 is provided. In the following description of the semiconductor circuit device 200 according to the second embodiment, portions relating to the thin film circuit element including the inductance circuit 13 will be mainly described.

As shown in FIGS. 3A and 3B, the semiconductor circuit device 200 according to the second embodiment includes a semiconductor circuit 30 provided on a main surface 10a of a semiconductor substrate 10 having a rectangular shape, and the thin film circuit element 40 including the inductance circuit 13 provided on an opposite surface (upper surface) 11a of a first insulating film 11 provided on the main surface 10a. The opposite surface (upper surface) 11a is a surface on the side opposite to a surface of the first insulating film 11 in contact with the semiconductor substrate 10. Further, the semiconductor circuit device 200 is provided with external connection terminals 20, 21, 22, and 23 and the like on the opposite surface (upper surface) 11a of the first insulating film 11, but the external connection terminals 20, 21, 22, and 23 and the like are similar to those of the first embodiment and thus the descriptions thereof are omitted. Elements that constitute the semiconductor circuit 30 or wires that electrically connect lands are provided on the main surface 10a or an insulating portion 12, but the elements or wires are omitted in FIGS. 3A and 3B.

The semiconductor substrate 10 is provided with the insulating portion 12 at a surface layer portion on the main surface 10a side. In the embodiment, a surface of the semiconductor substrate 10 including a front surface of the insulating portion 12 is defined as the main surface 10a.

The configuration of the semiconductor circuit 30 (e.g., a resistance circuit 26, a capacitance element 27, the inductance circuit 13, a resistance element 34, a capacitance element 35, etc.), the configuration of the external connection terminals 20, 21, 22, and 23, and the configuration of through-electrodes 14 and 18 are similar to those of the first embodiment, and therefore, the descriptions thereof are omitted.

The thin film circuit element 40 includes the inductance circuit 13, which is formed in a spiral form with a square planar shape, and is provided on the opposite surface 11a opposite to the surface of the first insulating film 11 in contact with the semiconductor substrate 10. The inductance circuit 13 is composed of a thin film having conductivity.

The inductance circuit 13 is composed of a thin film formed using, as the thin film material, a single layer of copper (Cu), gold (Au), silver (Ag), or nickel (Ni), or a multi-layer film using the metals together.

One end of the inductance circuit 13 formed in a spiral form is connected to a land electrode 29 provided on the opposite surface 11a of the first insulating film 11, and is connected to, for example, a vibrator (not shown) (the vibrating element 33) via the external connection terminal 23. Moreover, the other end of the inductance circuit 13 is connected to the through-electrode 14 via a first lead wire 13b. The through-electrode 14 is connected to a second lead wire 15a provided on the insulating portion 12, and is connected to the through-electrode 18 via a third lead wire 16a extended from the second lead wire 15a.

The through-electrode 18 is connected with the external connection terminal 20 via a land electrode 28 provided on the opposite surface 11a of the first insulating film 11, and is connected to the vibrator (the vibrating element 33), oscillation circuit, or the like (not shown). That is, both ends of the inductance circuit 13 formed in a spiral form are connected in an oscillation loop of the oscillation circuit (not shown) via the external connection terminals 20 and 23.

The semiconductor circuit device 200 according to the second embodiment has, in addition to the advantageous effects described in the first embodiment, the following advantageous effect.

According to the semiconductor circuit device 200 of the second embodiment, since the semiconductor circuit 30 and the inductance circuit 13 (the thin film circuit element 40) are provided via the first insulating film 11, it is possible to reduce an electrical insulation failure such as a short circuit between the semiconductor circuit 30 and the inductance circuit 13 (the thin film circuit element 40).

Third Embodiment

Figure 4:
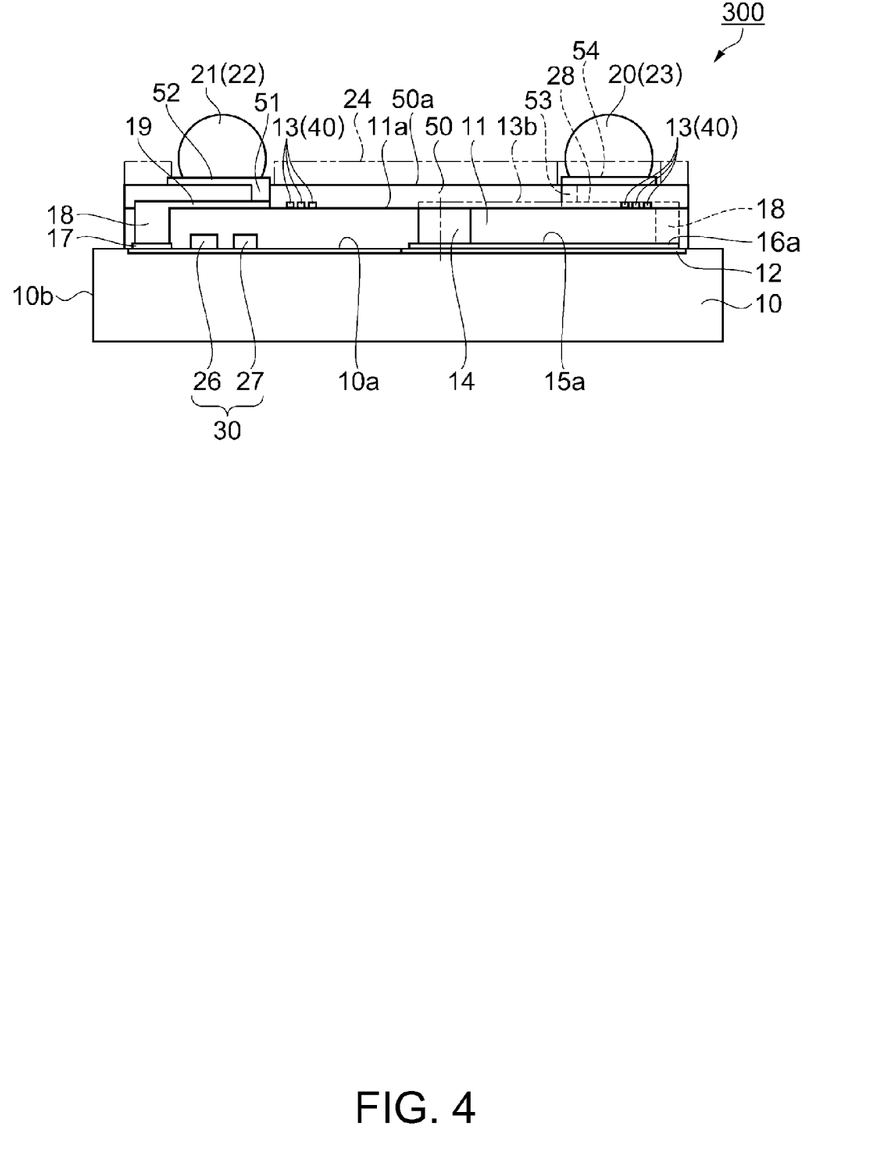
FIG. 4 shows a semiconductor circuit device according to a third embodiment and is a cross-sectional view corresponding to a cross-section taken along the line B-B in FIG. 3A.

A semiconductor circuit device according to a third embodiment of the invention will be described with reference to FIG. 4. For the semiconductor circuit device of the third embodiment, a semiconductor circuit device including at least a circuit for oscillation similar to that of the first embodiment will be illustrated. FIG. 4 shows the semiconductor circuit device according to the third embodiment and is a cross-sectional view corresponding to a cross-section taken along the line B-B in FIG. 3A. Configurations similar to those of the first embodiment are denoted by the same reference numerals and signs, and the descriptions thereof are omitted in some cases.

The semiconductor circuit device 300 according to the third embodiment differs from the semiconductor circuit device 200 according to the second embodiment in the positions at which external connection terminals 20, 21, 22, and 23 are provided. In the following description of the semiconductor circuit device 300 according to the third embodiment, portions relating to the positions at which the external connection terminals 20, 21, 22, and 23 are provided will be mainly described.

As shown in FIG. 4, the semiconductor circuit device 300 according to the third embodiment includes a semiconductor circuit 30 provided on a main surface 10a of a semiconductor substrate 10 having a rectangular shape (not shown), and a thin film circuit element 40 including an inductance circuit 13 provided on an opposite surface (upper surface) 11a of a first insulating film 11 provided on the main surface 10a. The opposite surface (upper surface) 11a is opposite to a surface of the first insulating film 11 in contact with the semiconductor substrate 10. Further, the semiconductor circuit device 300 includes a second insulating film 50 provided, on the opposite surface (upper surface) 11a of the first insulating film 11 opposite to the surface thereof in contact with the semiconductor substrate 10, so as to cover the thin film circuit element 40 including the inductance circuit 13. Moreover, the semiconductor circuit device 300 includes the external connection terminals 20, 21, 22, and 23 provided on an upper surface 50a of the second insulating film 50. The upper surface 50a is a surface on the side opposite to a surface of the second insulating film 50 in contact with the first insulating film 11.

Similarly to the first embodiment, elements that constitute the semiconductor circuit 30 or wires that electrically connect lands are provided on the main surface 10a or an insulating portion 12, but the elements or wires are omitted in FIG. 4.

The semiconductor substrate 10 is provided with the insulating portion 12 at a surface layer portion on the main surface 10a side. In the embodiment, a surface of the semiconductor substrate 10 including a front surface of the insulating portion 12 is defined as the main surface 10a.

The configuration of the semiconductor circuit 30 (e.g., a resistance circuit 26, a capacitance element 27, the inductance circuit 13, a resistance element 34, etc.) and the configuration of through-electrodes 14 and 18 are similar to those of the first embodiment, and therefore, the descriptions thereof are omitted.

The external connection terminals 20 and 21 are connected to land electrodes 52 and 54 provided on the upper surface 50a of the second insulating film 50. The land electrodes 52 and 54 are connected to second through-electrodes 51 and 53 penetrating the second insulating film 50 in a direction of a front surface (surface on the main surface 10a side of the semiconductor substrate 10) and a back surface (surface on the side opposite to the surface on the main surface 10a side) of the second insulating film 50.

The land electrode 52 connected with the external connection terminal 21 is connected with the second through-electrode 51, and is connected to the semiconductor circuit 30 via a land electrode 19 provided on the first insulating film 11, the through-electrode 18 provided through the first insulating film 11, and the like. Moreover, the land electrode 54 connected with the external connection terminal 20 is connected with the second through-electrode 53, and is connected via the second through-electrode 53 to a land electrode 28 provided on the opposite surface (upper surface) 11a of the first insulating film 11.

The land electrode 28 is connected to the inductance circuit 13 via the through-electrode 18 penetrating the first insulating film 11, a third lead wire 16a and a second lead wire 15a provided on the insulating portion 12, the through-electrode 14 penetrating the first insulating film 11, a first lead wire 13b provided on the opposite surface (upper surface) 11a, and the like. That is, the external connection terminal 20 is electrically connected to one end of the inductance circuit 13.

The external connection terminals 22 and 23 are also configured similarly, and the descriptions thereof are omitted.

Moreover, similarly to the first embodiment, the external connection terminal 20, 21, 22, or 23 is disposed at a position overlapping the semiconductor circuit 30 and not overlapping the inductance circuit 13 (the thin film circuit element 40) in the plan view.

According to the semiconductor circuit device 300 according to the third embodiment, the second insulating film 50 prevents an electrical short circuit between the inductance circuit 13 (the thin film circuit element 40) and the external connection terminals 20, 21, 22, and 23, and also, the external connection terminals 20, 21, 22, and 23 can be used as a shield electrode of the semiconductor circuit 30. Therefore, it is possible to suppress the influence of external noise on the semiconductor circuit 30, and when, for example, the semiconductor circuit 30 is used as an oscillation circuit, it is possible to reduce the possibility that external noise may constitute noise for the oscillation frequency.

Electronic Apparatus

Next, electronic apparatuses to which the semiconductor circuit device 100, 200, or 300 according to one embodiment of the invention is applied will be described in detail based on FIGS. 5 to 7. In the description, examples in which the semiconductor circuit device 100 is applied are shown.

Figure 5:
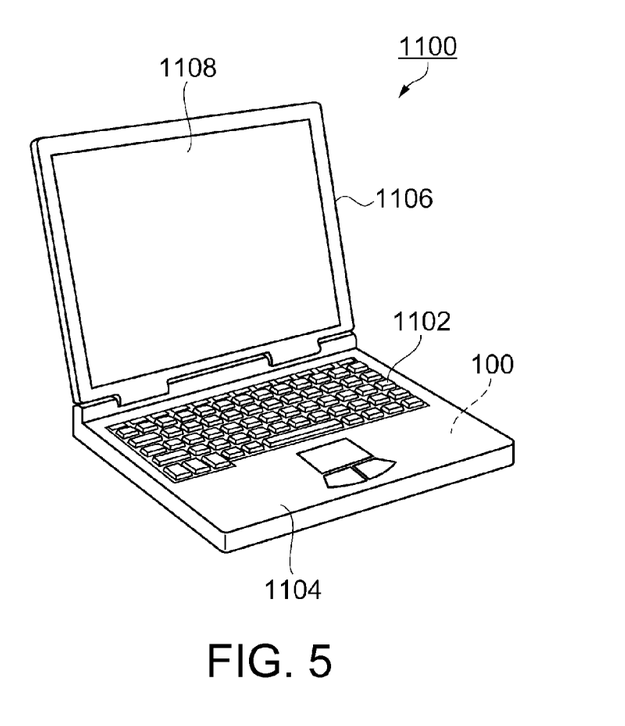
FIG. 5 is a perspective view showing a configuration of a mobile personal computer as an example of an electronic apparatus.

FIG. 5 is a perspective view showing a schematic configuration of a mobile (or notebook) personal computer as an electronic apparatus including the semiconductor circuit device 100 according to one embodiment of the invention. In the drawing, the personal computer 1100 is composed of a main body portion 1104 including a keyboard 1102, and a display unit 1106 including a display portion 1108. The display unit 1106 is rotatably supported to the main body portion 1104 via a hinge structure portion. Into the personal computer 1100, the semiconductor circuit device 100 having a function of detecting angular velocity is built.

Figure 6:
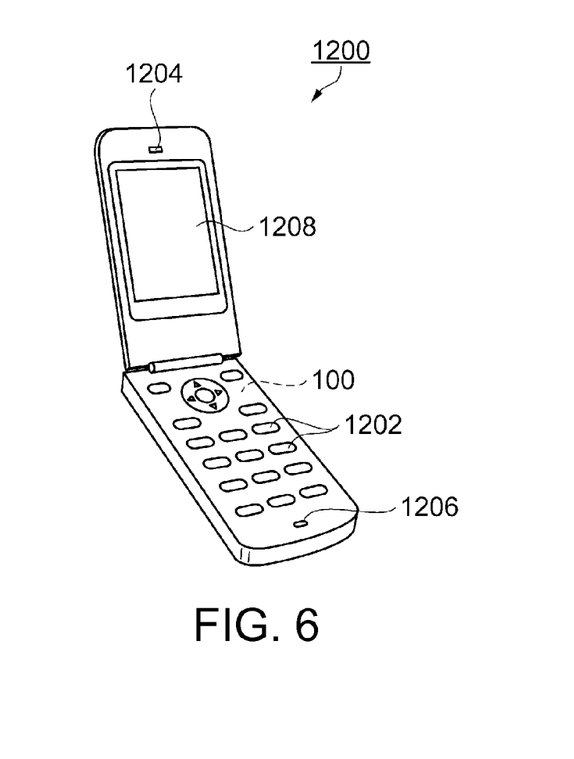
FIG. 6 is a perspective view showing a configuration of a mobile phone as an example of an electronic apparatus.

FIG. 6 is a perspective view showing a schematic configuration of a mobile phone (including a PHS) as an electronic apparatus including the semiconductor circuit device 100 according to one embodiment of the invention. In the drawing, the mobile phone 1200 includes a plurality of operation buttons 1202, an earpiece 1204, and a mouthpiece 1206. A display portion 1208 is disposed between the operation buttons 1202 and the earpiece 1204. Into the mobile phone 1200, the semiconductor circuit device 100 is built.

Figure 7:
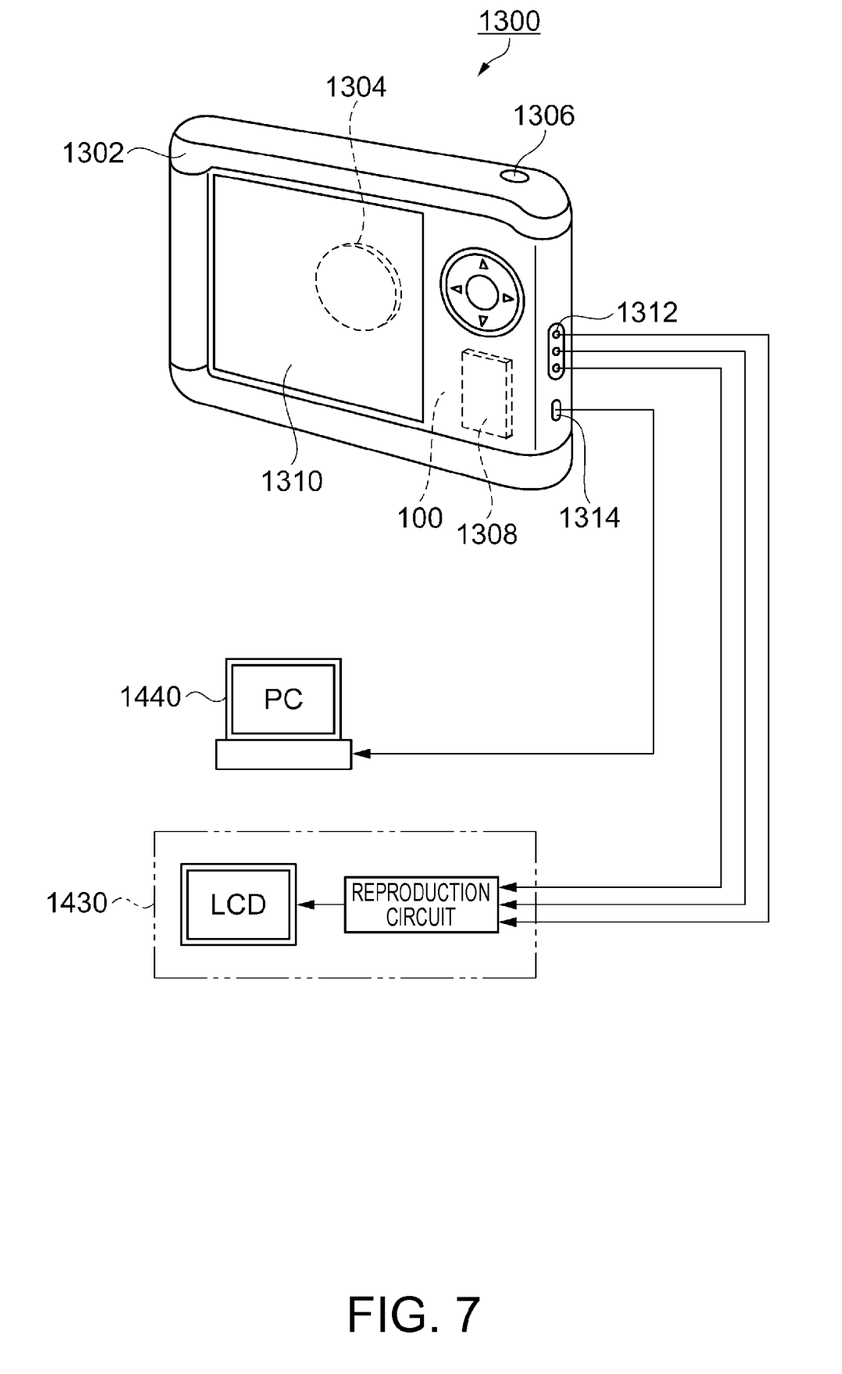
FIG. 7 is a perspective view showing a configuration of a digital still camera as an example of an electronic apparatus.

FIG. 7 is a perspective view showing a schematic configuration of a digital still camera as an electronic apparatus including the semiconductor circuit device 100 according to one embodiment of the invention. In the drawing, connections with external apparatuses are also shown in a simplified manner. Here, existing film cameras expose a silver halide photographic film with an optical image of a subject, whereas the digital still camera 1300 photoelectrically converts the optical image of the subject with an imaging device such as a CCD (Charge Coupled Device) to generate imaging signals (image signals).

A display portion 1310 is provided on a back surface of a case (body) 1302 in the digital still camera 1300 and configured to perform display based on the imaging signals generated by the CCD. The display portion 1310 functions as a finder that displays the subject as an electronic image. Moreover, on the front side (the rear side in the drawing) of the case 1302, a light receiving unit 1304 including an optical lens (imaging optical system) and the CCD is provided.

When a photographer confirms the subject image displayed on the display portion 1310 and presses down a shutter button 1306, imaging signals of the CCD at the time are transferred to and stored in a memory 1308. In the digital still camera 1300, a video signal output terminal 1312 and a data communication input/output terminal 1314 are provided on a side surface of the case 1302. Then, as shown in the drawing, a television monitor 1430 and a personal computer 1440 are connected as necessary to the video signal output terminal 1312 and the data communication input/output terminal 1314, respectively. Further, the imaging signals stored in the memory 1308 are output to the television monitor 1430 or the personal computer 1440 by a predetermined operation. Into the digital still camera 1300, the semiconductor circuit device 100 is built.

In addition to the personal computer (mobile personal computer) in FIG. 5, the mobile phone in FIG. 6, and the digital still camera in FIG. 7, the semiconductor circuit device 100 according to one embodiment of the invention can also be applied to the following electronic apparatuses. The semiconductor circuit device 100 can be applied to electronic apparatuses such as inkjet ejection apparatuses (e.g., inkjet printers), laptop personal computers, tablet personal computers, storage area network apparatuses such as routers or switches, local area network apparatuses, apparatuses for mobile terminal base station, television sets, video camcorders, video recorders, car navigation systems, real-time clock devices, pagers, electronic notebooks (including those with communication function), electronic dictionaries, calculators, electronic gaming machines, word processors, workstations, videophones, surveillance television monitors, electronic binoculars, POS terminals, medical apparatuses (e.g. electronic thermometers, sphygmomanometers, blood glucose meters, electrocardiogram measuring systems, ultrasonic diagnosis apparatuses, and electronic endoscopes), fishfinders, various types of measuring instrument, indicators (e.g., indicators used in vehicles, aircraft, and ships), flight simulators, head-mounted displays, motion tracing, motion tracking, motion controllers, and PDR (pedestrian dead reckoning).

Moving Object

Figure 8:
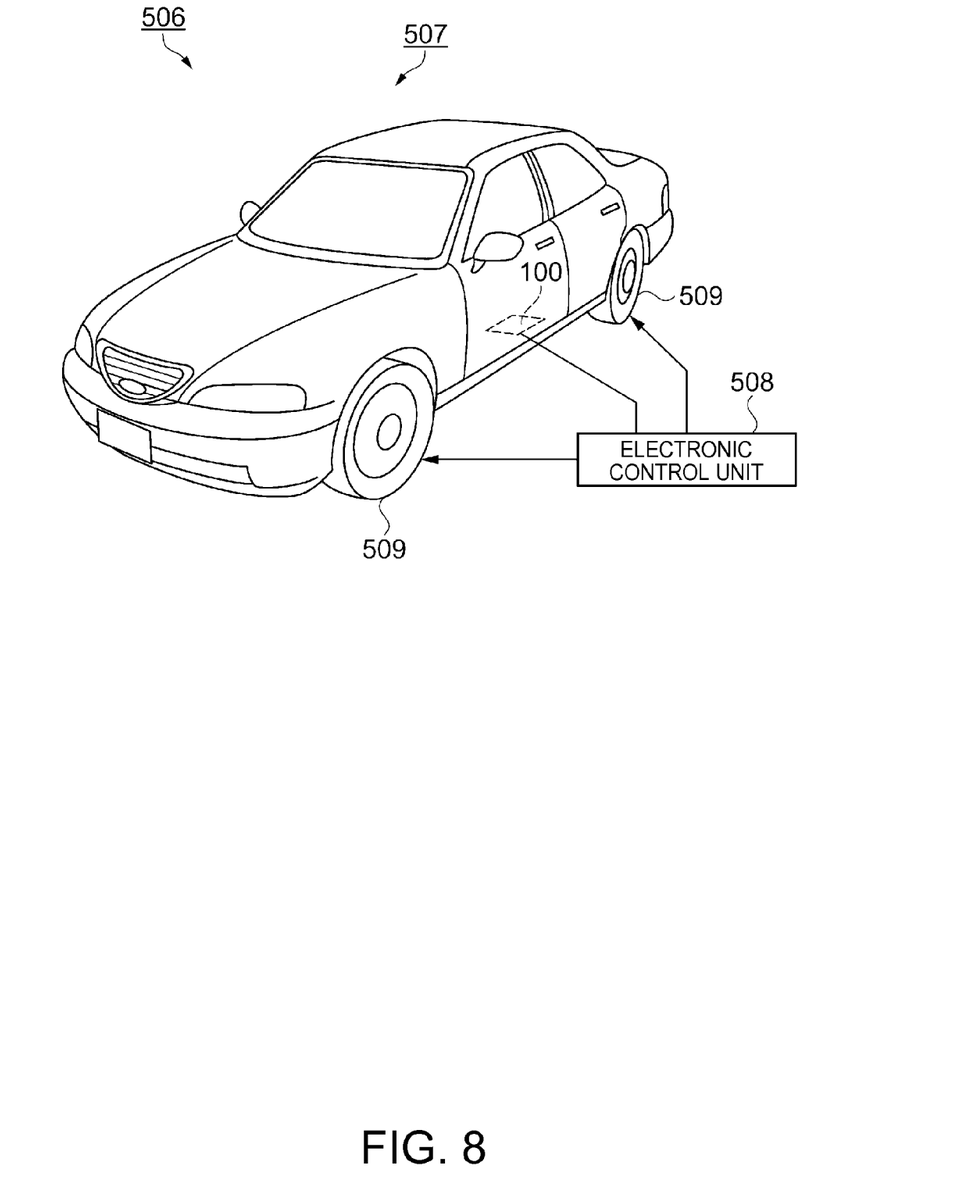
FIG. 8 is a perspective view showing a configuration of an automobile as an example of a moving object.

FIG. 8 is a perspective view schematically showing an automobile as an example of a moving object. In the automobile 506, the semiconductor circuit device 100 according to the invention is mounted. For example, as shown in the drawing, an electronic control unit (ECU) 508 into which the semiconductor circuit device 100 is built to control tires 509 is mounted in a car body 507 in the automobile 506 as a moving object. Moreover, the semiconductor circuit device 100 can be widely applied to ECUs such as for keyless entry systems, immobilizers, car navigation systems, car air-conditioners, anti-lock brake systems (ABSs), air bags, tire pressure monitoring systems (TPMSs), engine control, brake systems, battery monitors of hybrid and electric automobiles, and car body attitude control systems.

The entire disclosure of Japanese Patent Application No. 2014-151565, filed Jul. 25, 2014 is expressly incorporated by reference herein.

What is claimed is:

1. A semiconductor device comprising:
    a semiconductor circuit provided on a main surface of a semiconductor substrate;
    a thin film circuit element disposed to face the main surface of the semiconductor substrate and including a conductive thin film;
    an insulating film provided over the main surface of the semiconductor substrate so that the semiconductor circuit is completely covered by the insulating film; and
    an external connection terminal provided on a top surface of the insulating film, wherein
    the semiconductor circuit is provided between the thin film circuit element and a peripheral of the semiconductor substrate in a plan view, and
    the semiconductor circuit is completely overlapped with the external connection terminal in the plan view.

2. The semiconductor circuit device according to claim 1, wherein
    the thin film circuit element is provided on the top surface of the insulating film.

3. The semiconductor circuit device according to claim 1, wherein
    the semiconductor circuit includes a capacitance element, and
    the thin film circuit element includes an inductance circuit.

4. The semiconductor circuit device according to claim 3, wherein
    the inductance circuit is a wire disposed in a spiral form in the plan view.

5. The semiconductor circuit device according to claim 3, wherein
    the semiconductor circuit includes a resistance circuit electrically connected to the inductance circuit.

6. The semiconductor circuit device according to claim 4, wherein
    the semiconductor circuit includes a resistance circuit electrically connected to the inductance circuit.

7. The semiconductor circuit device according to claim 5, wherein
    a resistance value of the resistance circuit is variably controlled.

8. The semiconductor circuit device according to claim 6, wherein
    a resistance value of the resistance circuit is variably controlled.

9. An electronic apparatus comprising the semiconductor circuit device according to claim 1.

10. A moving object comprising the semiconductor circuit device according to claim 1.

* * * * *